(12) United States Patent
Richmond, II et al.

(10) Patent No.: US 7,385,407 B2
(45) Date of Patent: Jun. 10, 2008

(54) ASSEMBLY FOR ELECTRICALLY CONNECTING A TEST COMPONENT TO A TESTING MACHINE FOR TESTING ELECTRICAL CIRCUITS ON THE TEST COMPONENT

(75) Inventors: Donald P. Richmond, II, Palo Alto, CA (US); Jovan Jovanovic, Santa Clara, CA (US)

(73) Assignee: Aehr Test Systems, Fremont, CA (US)

( * ) Notice: Subject to any disclaimer, the term of this patent is extended or adjusted under 35 U.S.C. 154(b) by 36 days.

(21) Appl. No.: 11/433,845

(22) Filed: May 12, 2006

(65) Prior Publication Data

US 2006/0267624 A1   Nov. 30, 2006

Related U.S. Application Data

(62) Division of application No. 10/912,785, filed on Aug. 6, 2004, now Pat. No. 7,046,022, which is a division of application No. 10/197,104, filed on Jul. 16, 2002, now Pat. No. 6,867,608.

(51) Int. Cl.
*G01R 31/02* (2006.01)

(52) U.S. Cl. ...................... 324/754; 324/757

(58) Field of Classification Search ...................... None
See application file for complete search history.

(56) References Cited

U.S. PATENT DOCUMENTS 3,654,585 A * 4/1972 Wickersham ................ 439/65
4,783,719 A * 11/1988 Jamison et al. ............. 361/751
5,313,157 A    5/1994 Pasiecznik, Jr.
5,491,427 A * 2/1996 Ueno et al. .................. 324/754
5,974,662 A * 11/1999 Eldridge et al. .............. 29/842
6,005,401 A * 12/1999 Nakata et al. ............... 324/754
6,137,297 A   10/2000 McNair et al.
6,292,007 B1   9/2001 Potter
6,897,672 B2 * 5/2005 Byrd ........................... 324/765
2002/0075025 A1  6/2002 Tanaka

FOREIGN PATENT DOCUMENTS

| CN | 1328644 | 6/2000 |
|---|---|---|
| EP | 0 639 777 | 2/1995 |
| EP | 0 639 777 A1 | 2/1995 |

* cited by examiner

*Primary Examiner*—Ernest Karlsen
(74) *Attorney, Agent, or Firm*—Blakely, Sokoloff, Taylor & Zafman; Stephen M. De Klerk

(57) ABSTRACT

In one embodiment, the invention provides a test assembly for electrically connecting a test component to a testing machine for testing electrical circuits on the test component. The assembly comprises a contactor assembly to interconnect with the test component, a probe assembly to mechanically support the contactor assembly and electrically connect the contactor assembly to the testing machine, and a clamping mechanism comprising a first clamping member and a second clamping member, the clamping members being urged together to exert a clamping force to deform contactor bumps of an electrical connection between the probe assembly and the contactor assembly.

4 Claims, 19 Drawing Sheets

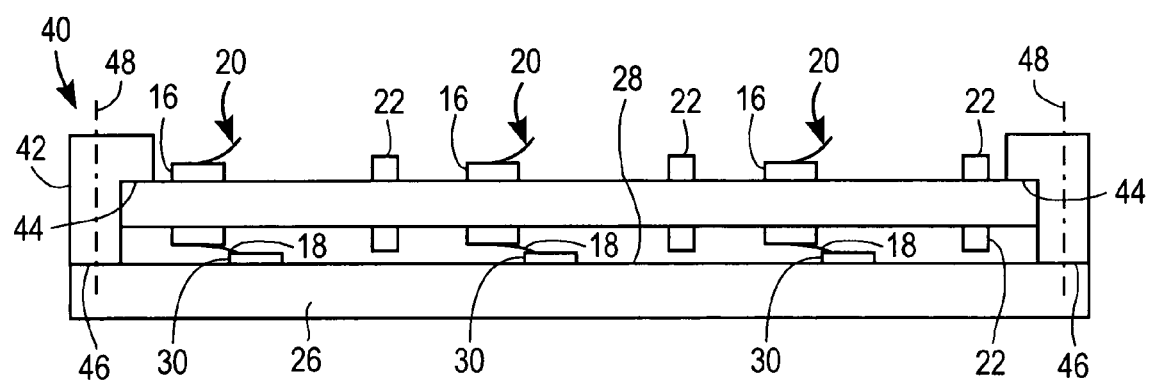
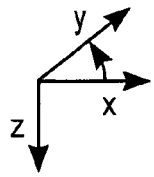
FIG. 2

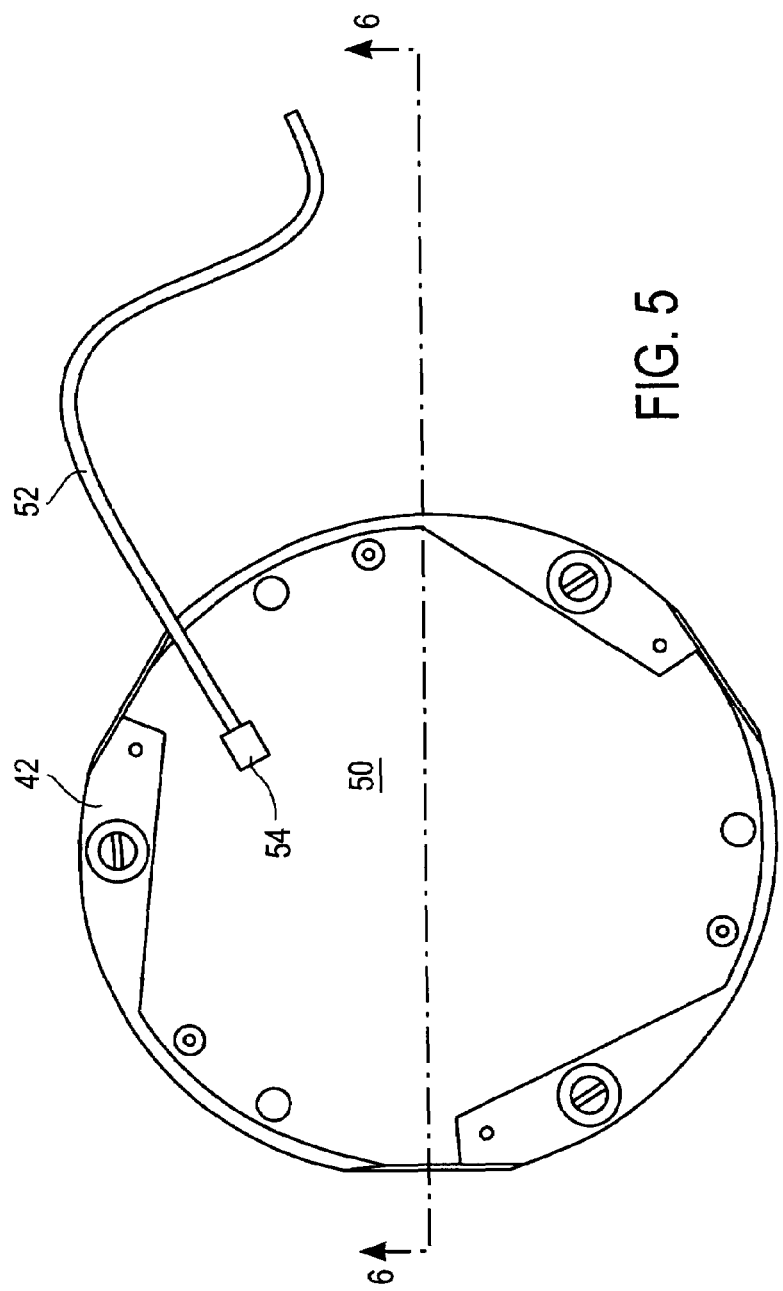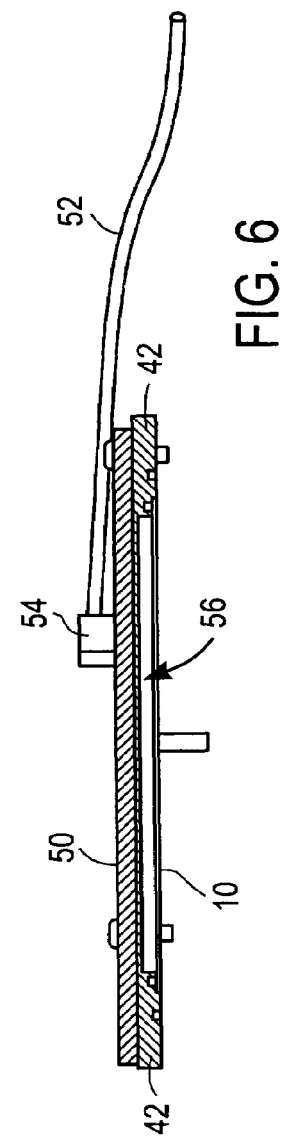

ASSEMBLY FOR ELECTRICALLY CONNECTING A TEST COMPONENT TO A TESTING MACHINE FOR TESTING ELECTRICAL CIRCUITS ON THE TEST COMPONENT

CROSS-REFERENCE TO OTHER APPLICATIONS

This application is a division of Ser. No. 10/912,785, filed Aug. 6, 2004, now U.S. Pat. No. 7,046,022 which is a division of Ser. No. 10/197,104, filed Jul. 16, 2002, now U.S. Pat. No. 6,867,608.

FIELD OF THE INVENTION

This invention relates to test equipment. In particular, it relates to test equipment for testing electrical circuits including integrated circuits.

BACKGROUND

When fabrication of electronic devices, such as computer processors and memories, have been completed, the electronic devices are subjected to burn-in and electrical testing in order to identify and eliminate defective devices before shipment. The term "burn-in" relates to operation of an integrated circuit at a predetermined temperature or temperature profile, typically an elevated temperature in an oven. Certain operating electrical bias levels and/or signals are supplied to the electronic devices while they are at the elevated temperature. The use of the elevated temperature accelerates stress to which the devices are subjected during burn-in, so that marginal devices that would otherwise fail shortly after being placed in service fail during burn-in, and are therefore not shipped.

Test equipment for burn-in testing of electrical circuits generally comprise a connection arrangement for electrically connecting an electrical circuit to be tested such as an integrated circuit on a wafer or test substrate, to a test probe circuit.

SUMMARY

In one embodiment, the invention provides a test assembly for electrically connecting a test component to a testing machine for testing electrical circuits on the test component. The assembly comprises a contactor assembly to interconnect with the test component, a probe assembly to mechanically support the contactor assembly and electrically connect the contactor assembly to the testing machine, and a clamping mechanism comprising a first clamping member and a second clamping member, the clamping members being urged together to exert a clamping force to deform conductive bumps of an electrical connection between the probe assembly and the contactor assembly.

BRIEF DESCRIPTION OF THE DRAWINGS

The invention is described by way of example with reference to the accompanying drawings wherein:

FIG. 2 is a block diagram of a contactor assembly in accordance with one embodiment of the invention;

FIG. 5 is a top plan view of the vacuum plate and ring of FIG. 4;

FIG. 6 is a section on 6-6 in FIG. 5;

DETAILED DESCRIPTION

Figure 1:
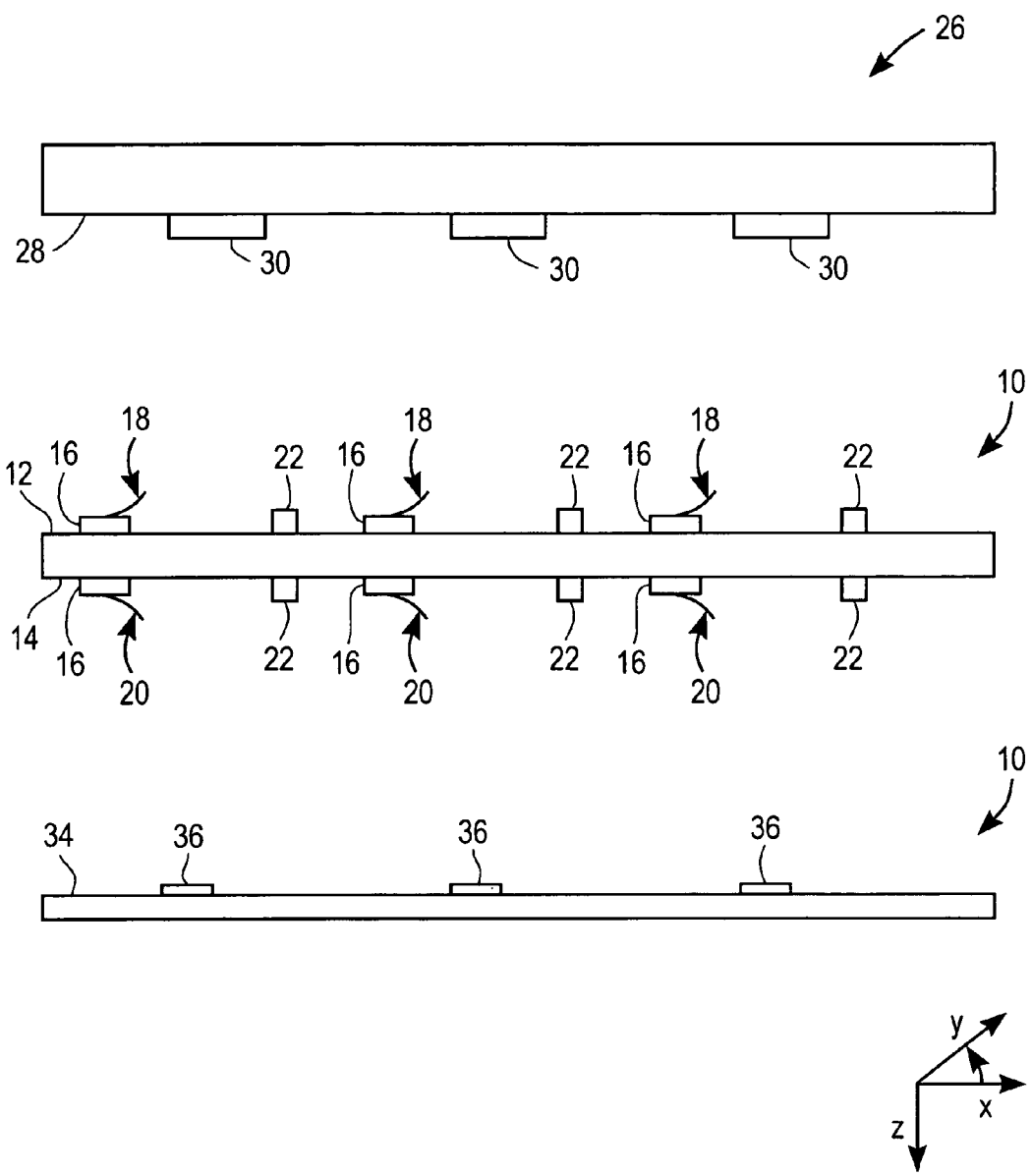
FIG. 1 is a block diagram of an interposer, an electrical contactor and a wafer comprising circuits to be tested.

FIG. 1 of the accompanying drawings illustrates an interposer 10 and an electrical contactor 26 which together form a contactor assembly, according to an embodiment of the invention, used to test electrical circuits, for example, on a wafer 32.

As will be seen from FIG. 1, the interposer 10 includes a substrate having a first side 12 and a second side 14. The interposer 10 includes a number of electrical terminals 16 on the first side 12. The interposer 10 also includes resilient interconnection elements in the form of interconnection spring elements 18. Each interconnection spring element 18 extends from an electrical terminal 16 on the side 12 and terminates in a free end. The purpose of each interconnection spring elements 16 is to make good electrical contact with corresponding electrical terminals on the electrical contactor 26. In other embodiments, the resilient interconnection elements include pogo pins and compliant conductive bumps.

The interposer 10 also has an interconnection spring element 20 on each electrical terminal 16 on side 14. The interconnection spring elements 20 are similar to the interconnection spring elements 18 except that the interconnection spring elements 20 are for making electrical contact with corresponding electrical terminals on the wafer 32.

The interposer also includes mechanical alignment stops 22 on the sides 12 and 14 to prevent overtravel of the interconnection spring elements 18 and to prevent the interposer from touching certain areas of the wafer 32.

The electrical contactor 26 includes a contactor substrate which includes a side 28. Electrical contactor 26 also includes electrical terminals 30 on the side 28.

The wafer 32 is shown to include a side 34 which has the electrical circuits to be tested. The wafer 32 has electrical terminals 36 on the side 34 whereby electrical connection to the electrical circuits may be made.

FIG. 2 of the drawings shows a contactor assembly 40 in accordance with one embodiment of the invention. The assembly 40 includes an interposer 10 and a retaining component in the form of a ring 42. The interposer 10 is secured or held in a predetermined or aligned position relative to the electrical contactor 26 by a ring 42. It will be seen that in the predetermined or aligned position, each interconnection spring element 18 has been deformed against a spring force thereof to make electrical contact with a corresponding electrical terminal 30 of electrical contactor 26. The predetermined position is reached by moving the ring 42 and the interposer 10 seated therein until the alignment stops 22 bear against the side 28 of the electrical contactor 26. In other embodiments, the predetermined position is reached when sufficient pressure is exerted by the interconnection spring elements 18 (or the pogo pins or compliant conductive bumps in other embodiments) to keep the contactor 26 in place. The stops 22 are thus optional. A spacing between the interposer 10 and the electrical contactor 26 is such that each of the interconnection spring elements 18 is under compression.

Figure 4:
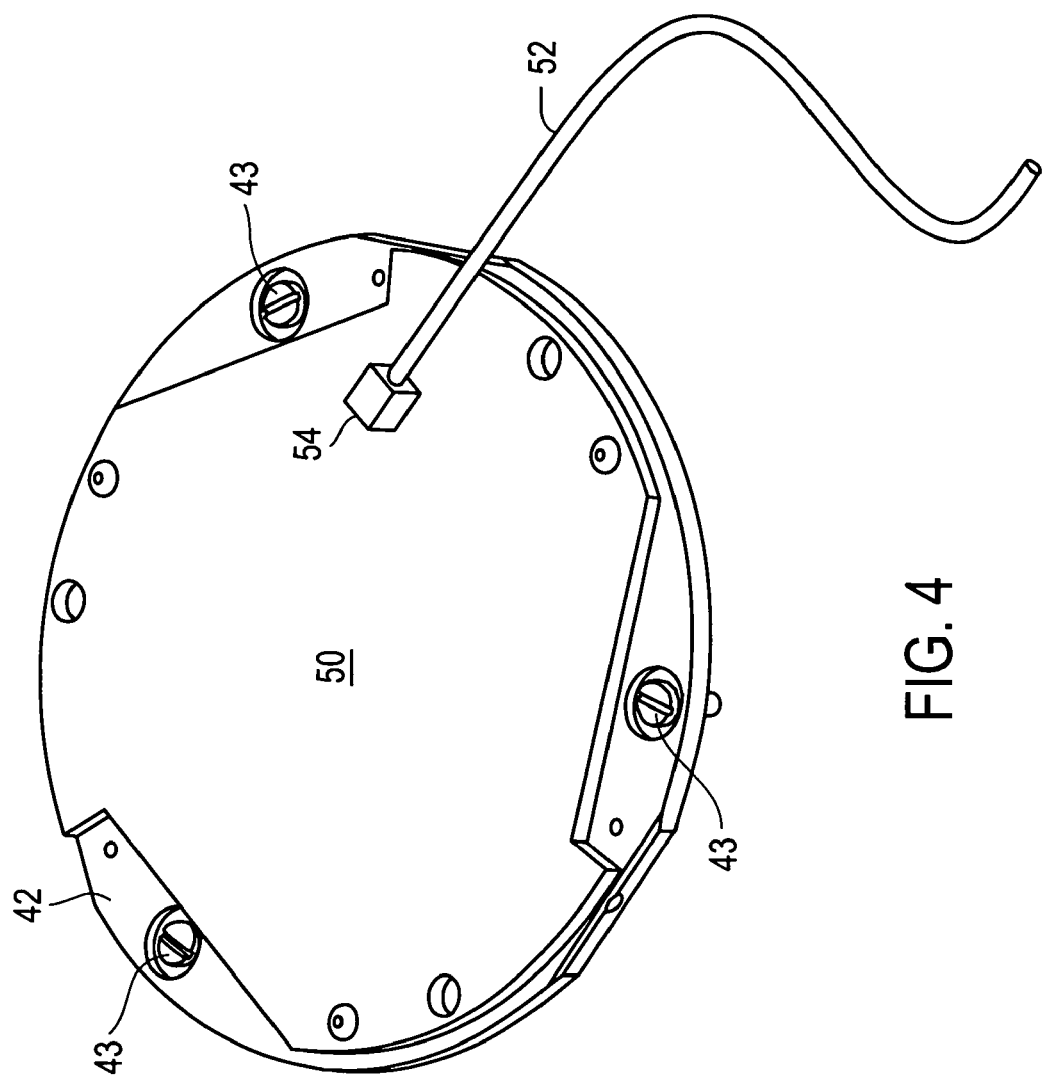
FIG. 4 is a perspective view of a vacuum plate connected to a ring, in accordance with one embodiment of the invention.

The ring 42 is formed with a recessed surface 44 which defines a seat for the interposer 10. The ring 42 has a flat flange-like face 46 which bears against side 28 of electrical contactor 26. The ring 42 is secured to the electrical contactor 26 by means of fasteners 43, for example screws, extending through screw holes 48 (see FIG. 4). The holes 48 are dimensioned to accommodate the fasteners 43 with some degree of play to permit alignment of fiducial markings on the interposer 10 and contactor 26, respectively.

Figure 3:
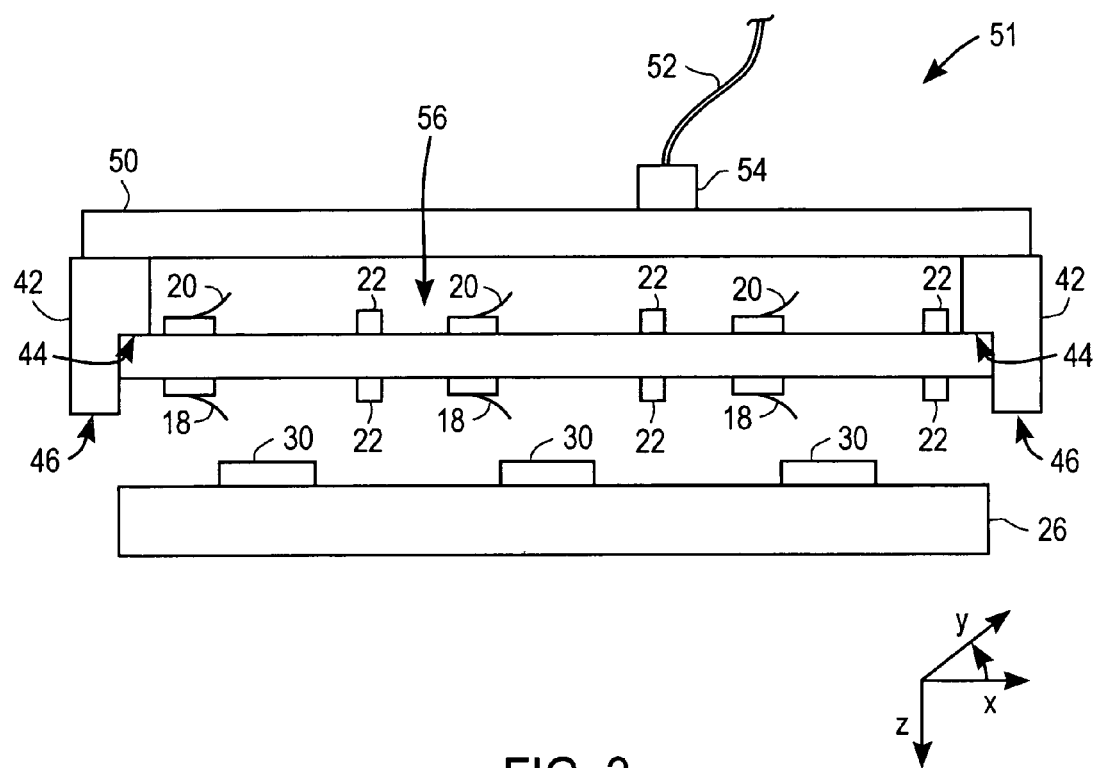
FIG. 3 is a block diagram illustrating a stage in the formation of the contactor assembly of FIG. 2.

FIG. 3 of the drawings shows a first stage in the formation of the contactor assembly 40. Referring to FIG. 3, a vacuum plate 50 is releasably secured to a side of the ring 42 opposing face 46 to form a sub-assembly 51. The vacuum plate 50 can be connected to a pump (not shown) by means of a coupling 54 and a hose 52 connected to the coupling 54. In use, the pump creates a vacuum in a region 56 between the vacuum plate 50 the interposer 10. The vacuum retains interposer 10 against the recessed surface 44. As can be seen from FIGS. 4 and 5, the vacuum plate 50 is shaped and dimensioned to provide access to the fasteners 43.

As can be seen from FIG. 6 which shows a sectional view through sub-assembly 51 taken at 6-6 in FIG. 5, the interposer 10 seats snugly in the ring 42.

Figure 7:
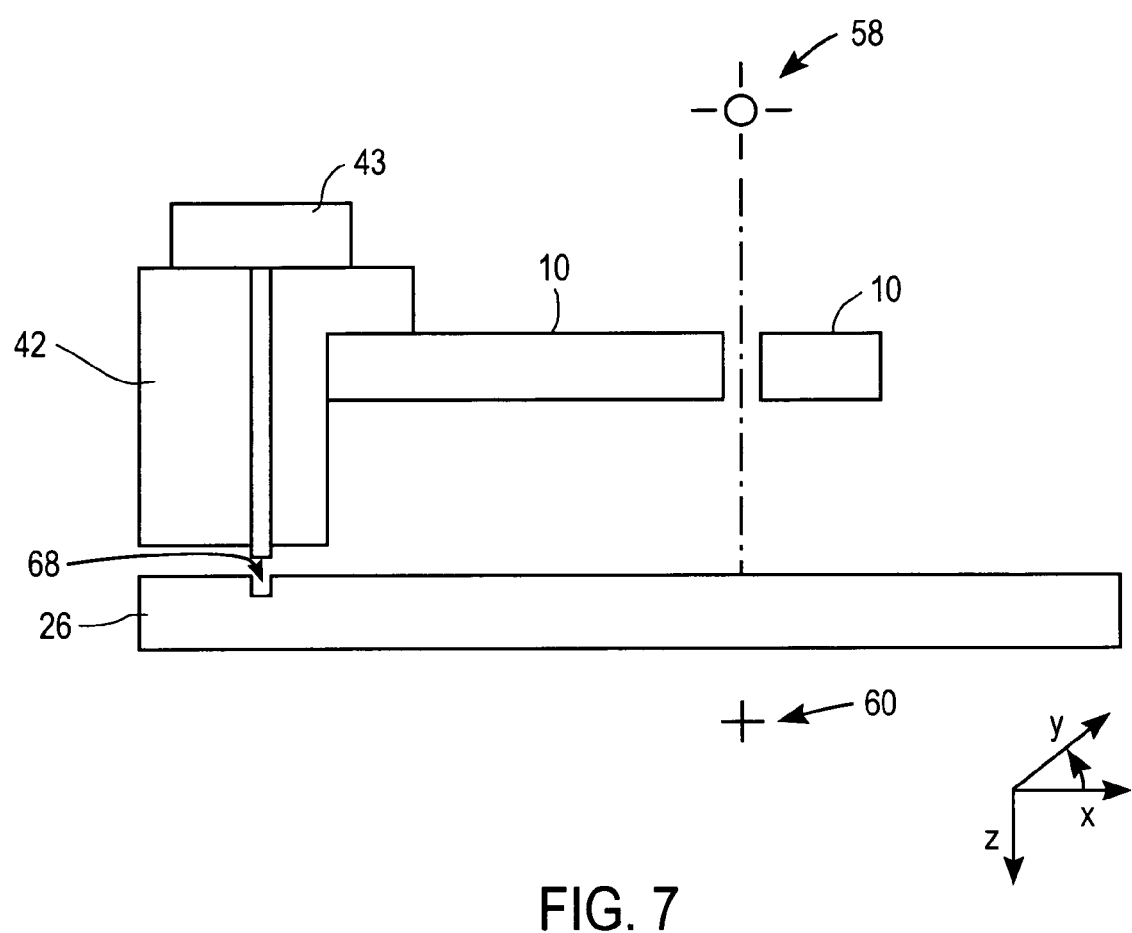
FIG. 7 is a block diagram illustrating how a ring and interposer seated therein may be aligned with a contactor, in accordance with one embodiment of the invention.

FIG. 7 of the drawings shows a block diagram of how alignment of the interposer 10 with the electrical contactor 26 is achieved. The interposer 10 is seated in the ring 42 and moved in an x, y, or Θ direction such that a fiducial marking 58 on the side 12 of the interposer 10 is aligned with a fiducial marking 60 on the side 28 of the electrical contactor 26. Once the fiducial marking 58 is aligned with the fiducial marking 60, the ring 42 together with the interposer 10 is displaced in a z direction so that the ring 42 makes contact with the electrical contactor 26. A screw 43 located in hole 48 is then screw-threaded into a complementary threaded socket 68 formed in electrical contactor 26. The fiducial markings 58, 60 allow for alignment for the electrical terminals 30 on the electrical contactor 26 with the ends of the interconnection spring elements 18 without having to take an image of the interconnection spring elements 18. Tolerances in the position of each interconnection spring element in the x-y plane or the angle at which it projects from the x-y plane do not effect the alignment process. The mechanical stops 22 on the side 18 of the interposer 10 may be used to limit movement of the interposer 10 towards the electrical contactor 26 when forming the assembly 40, such that each of the interconnection spring elements 18 is under the desired compression.

Figure 8:
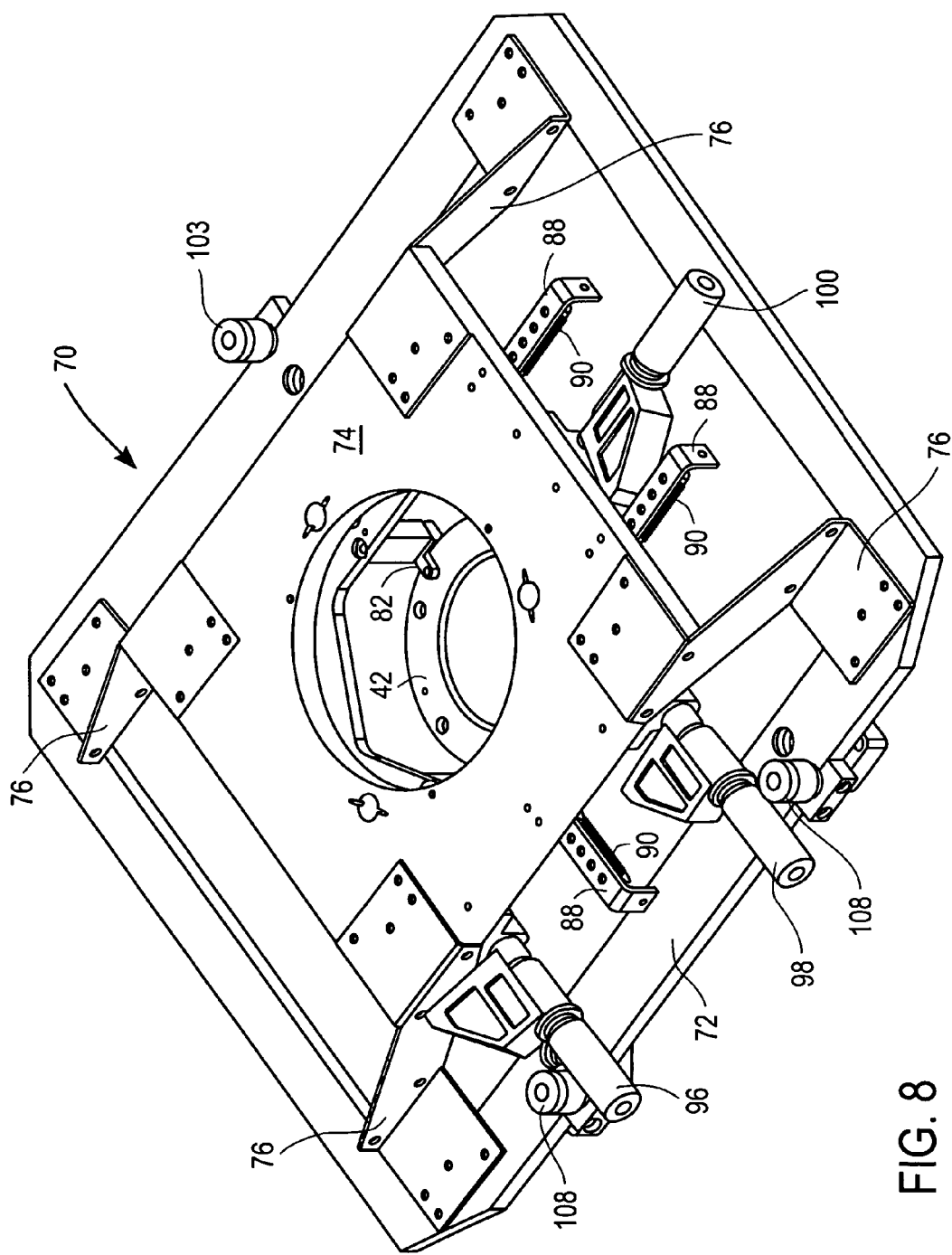
FIG. 8 is a perspective view of an alignment machine in accordance with one embodiment of the invention.
Figure 9:
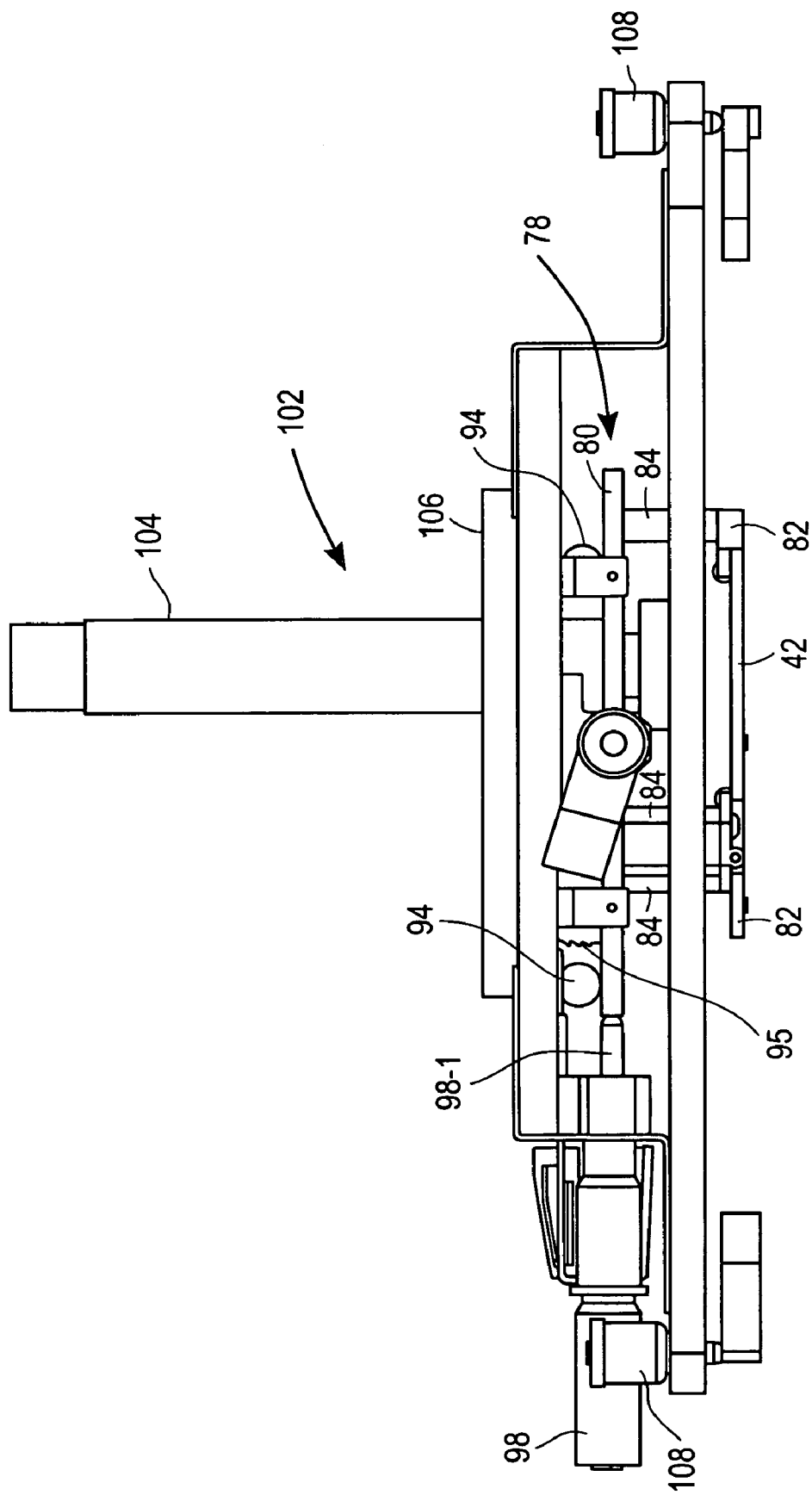
FIG. 9 is an end view of the alignment machine shown in FIG. 8 of the drawings with a microscope mounted thereon.

FIG. 8 of the drawings shows a perspective view of an alignment machine 70, in accordance with one embodiment of the invention, which may be used to align the ring 42 and interposer 10 combination with the electrical contactor 26. The alignment machine 70 includes a base 72 which is shaped and dimensioned to rest on a probe plate 152 which, in use, houses the electrical contactor 26. The alignment machine 70 also includes a raised platform or plate 74 which is secured to the base 72 by means of mounting brackets 76. The platform 74 supports a carriage 78. The carriage 78 is seen in FIG. 9 of the drawings which shows a side view of the alignment machine 70. The carriage 78 is secured to an underside of the platform 74 by means of a mounting arrangement comprising angle brackets 88 and horizontal springs 90. The angle brackets 88 are secured to the platform 74 and provide an anchor for one end of the springs 90, the other end of the springs 90 being secured to a floating plate 80 of carriage 78 as can be seen in FIG. 9 of the drawings.

The carriage 78 further includes ring holders 82 which are secured to the floating plate 80 of vertical members 84 extending between the ring holders mounting plate 82 and the floating plate 80.

Roller bearings 94 disposed between the platform 74 and the floating plate 80 allow for slidable displacement of the floating plate 80 relative to the platform 74. Vertical springs 95 urge the floating plate 80 into contact with roller bearings 94. It will be appreciated that the spring mounting arrangement of the floating plate 80 to the platform 74 allows for movement of the floating plate 80 in an x-y plane. Such movement in the x y plane is controlled by means of an adjustment mechanism which, in one embodiment, includes micrometers 96, 98, and 100, each of which can be operated to urge a tip thereof to bear against an edge of the floating plate 80 thereby to cause the displacement of floating plate 80. For example, as can be seen in FIG. 9 of the drawings, a tip 98.1 of the micrometer 98 may be displaced in a y direction to bear against an edge of the floating plate 80 thereby to cause the floating plate 80 to be displaced in the y direction. Because the ring holders 82 are rigidly connected to the floating plate 80, displacement of the floating plate 80 also causes corresponding displacement of the ring holders 82.

Figure 10:
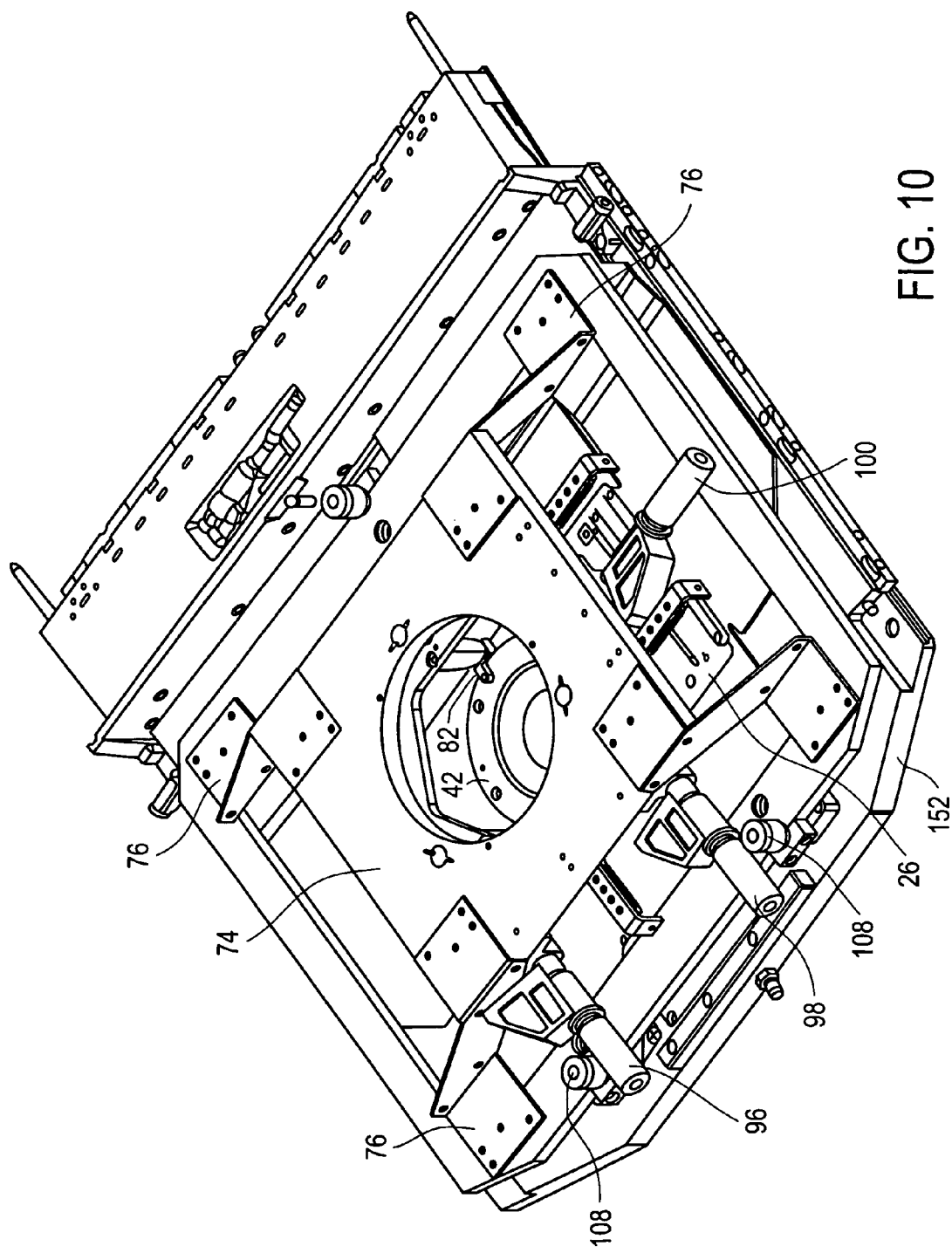
FIG. 10 is a perspective view of the alignment machine of FIG. 8 mounted on a probe plate.
Figure 11:
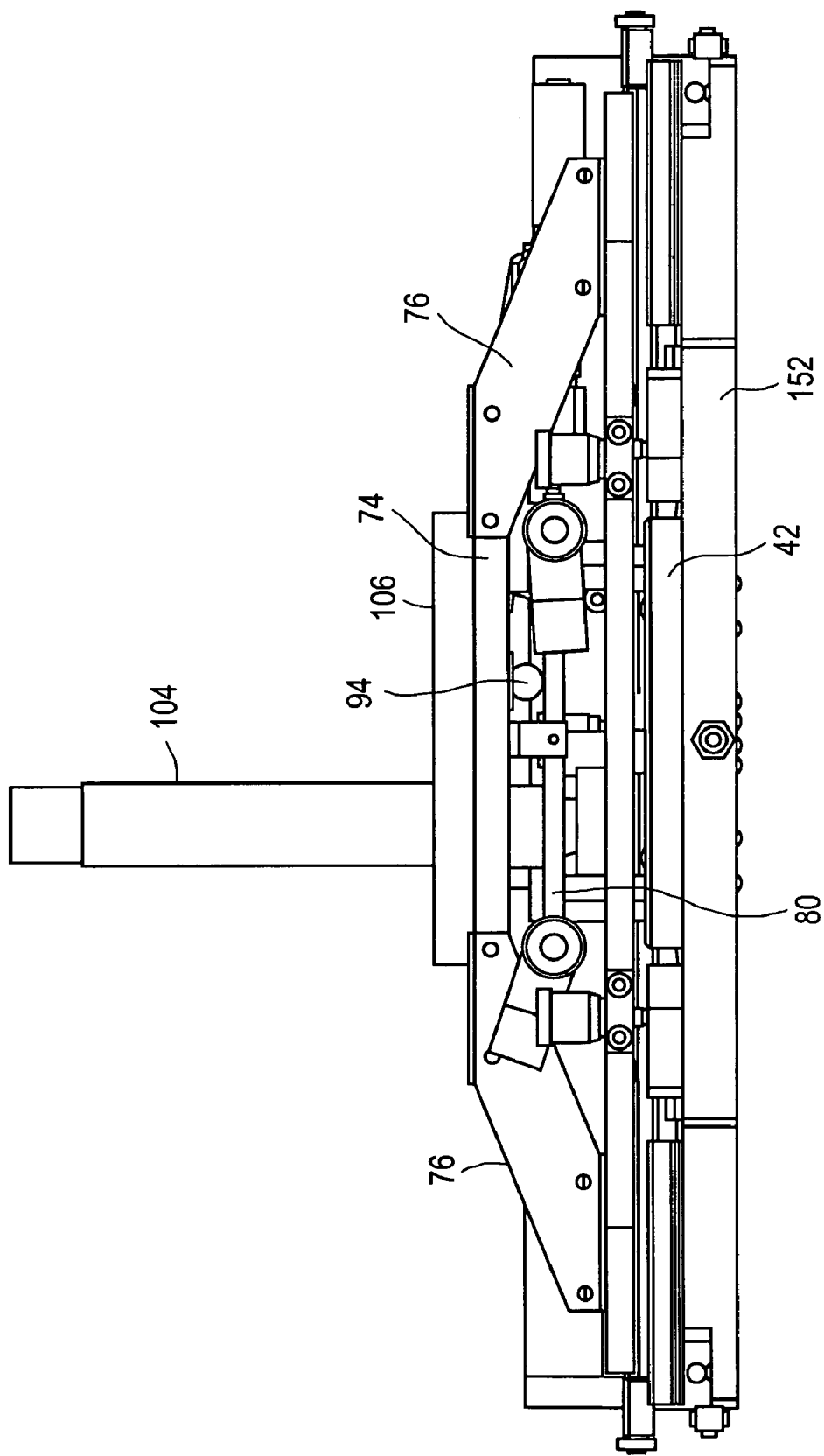
FIG. 11 is an end view of FIG. 10.

In use, the interposer 10 which is seated in the ring 42 by means of a suction force created with the aid of the vacuum plate 50 and a pump (not shown) is connected mechanically to the ring holders 82 of the carriage 78. Thereafter, the alignment machine 70 is positioned on a probe plate 152 as is shown in FIG. 10. In this position, the ring 42 and the interposer 10 which is seated in the ring 42 is positioned directly over the electrical connector 26 which is seated in the probe plate 152.

A magnification system comprising a microscope 102 which includes a scope section 104 and a base 106 is secured on the platform 74 as can be seen in FIG. 9 of the drawings.

The microscope 102 magnifies the fiducial markings 58, 60 on the interposer 10 and the electrical connector 26, respectively. The micrometers 96, 98 and 100 may then be operated to move the carriage 78, which carries the ring 42 and the interposer 10 with it, so that the interposer 10 may be positioned over the electrical connector 26 in a predetermined or aligned position in which the fiducial markings, 58, 60 on the interposer 10 and the electrical contactor 26, respectively, are in alignment.

The alignment machine 70, further includes micrometer heads 108 which may be operated to move the carriage 78 in a z direction which causes the interposer and ring combination to be displaced in the z direction towards the electrical contactor 26. In use, displacement in the z direction is continued until alignment the stops 22 contact the side 28 of electrical contactor 26, or the desired z position is reached. When this position is reached, the screws 43 are screwed into the sockets 68 in the electrical contactor 26, thereby to secure the ring 42 and the interposer 10 seated therein to the electrical contactor 26.

Once the ring 42 and the interposer 10 are secured to the electrical contactor 26, the vacuum plate 50 and the alignment machine 70 are removed. The probe plate 152 includes an external interface component 164 comprising a plurality of electrical connectors in the form of electrical pins 166 as can be seen in FIG. 12. A flexible connector 110 electrically connects the contactor assembly 40 to the interface component 164 which in turn is electrically connected to a burn-in chamber of a testing machine (not shown) via the pins 166.

Figure 13A:
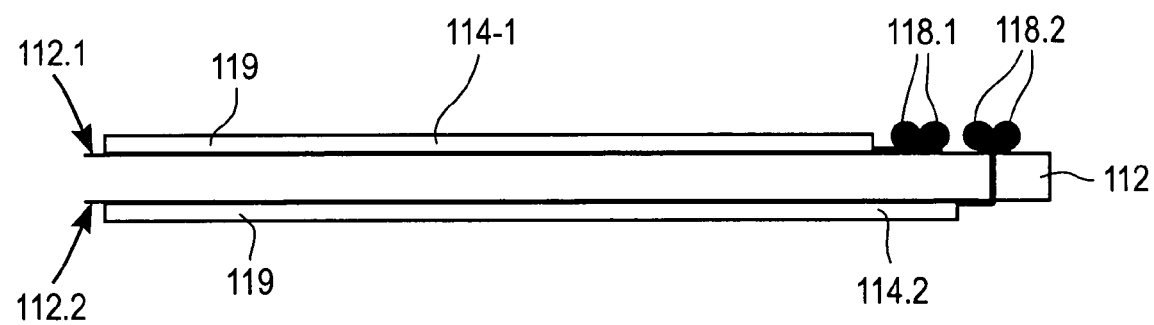
FIG. 13B is a block diagram of an end of the flexible connector of FIG. 13A.
Figure 13B:
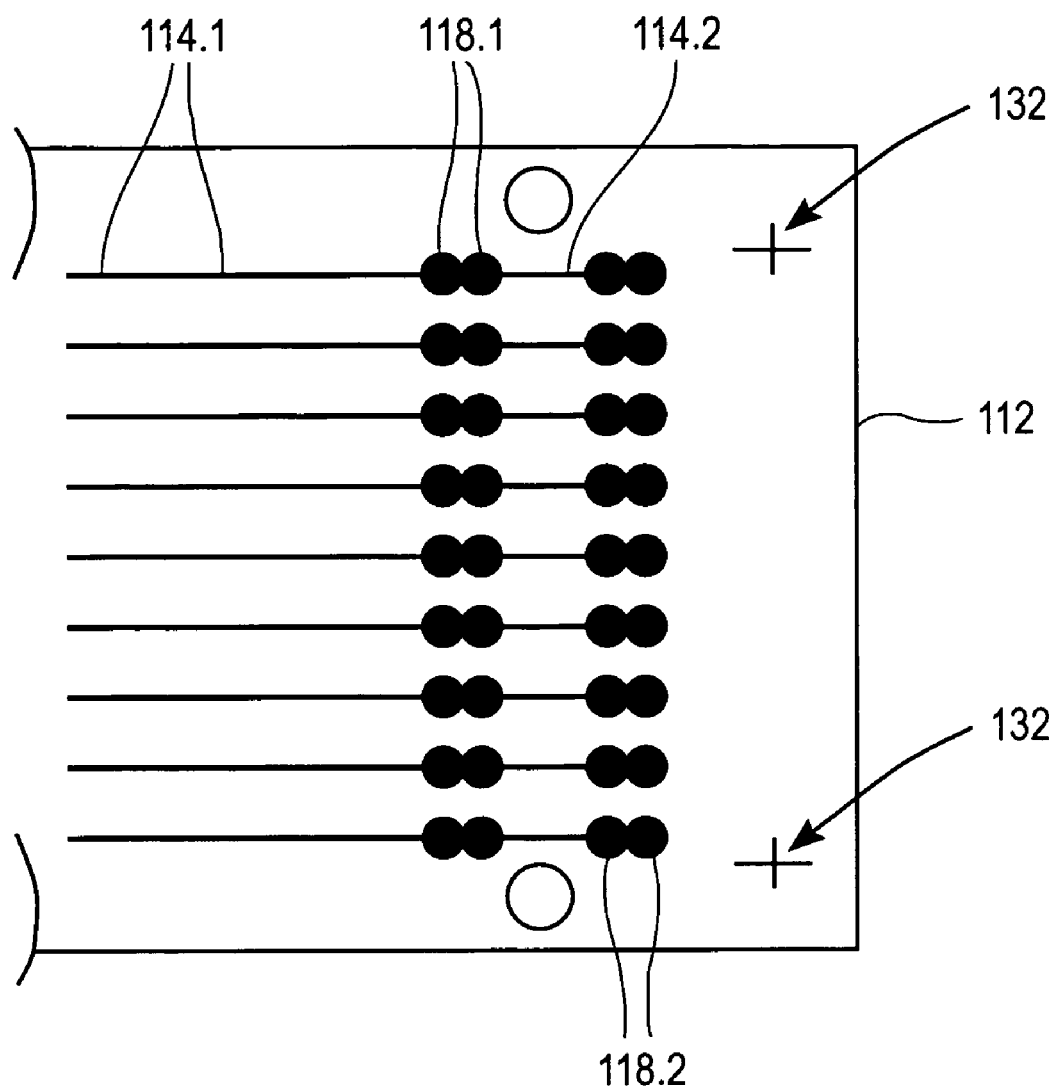
Figure 14:
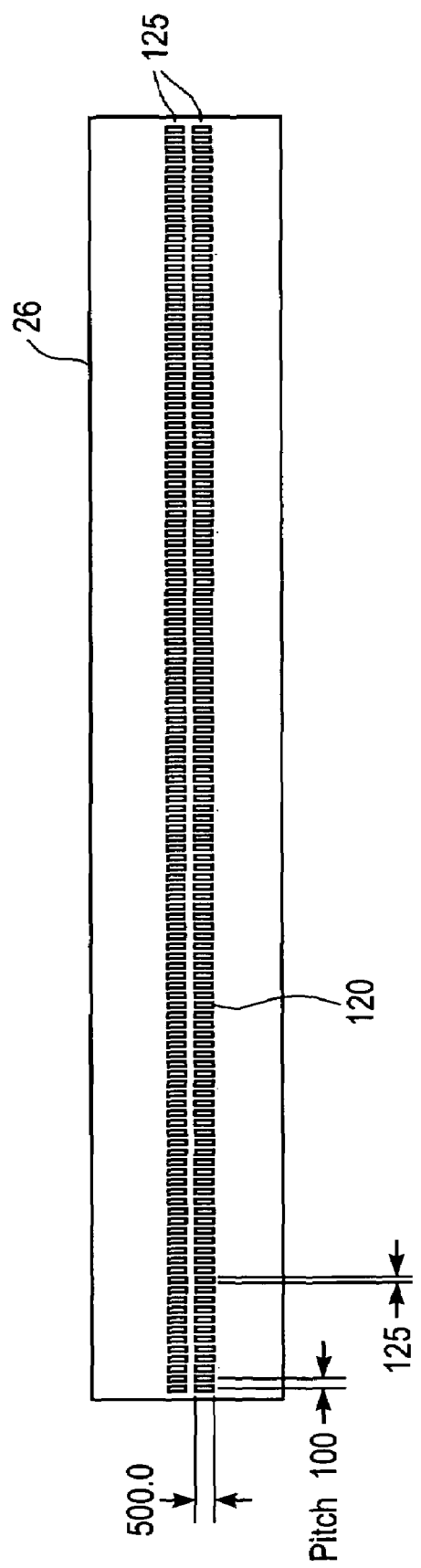
FIG. 14 shows an arrangement of electrical contact elements on an electrical contactor in accordance with one embodiment of the invention.

The flexible connector 110 includes a flexible substrate 112 having sides 112.1 and 112.2 as can be seen in FIG. 13A. Further, the flexible substrate 112 has a first end 115 and a second end 116. Flexible line conductors 114.1 and 114.2 are formed on the sides 112.1 and 112.2 respectively, as can be seen in FIGS. 13A and 13B of the drawings. Each flexible line conductor 114.1 has a first end which is electrically connected to the interface component 164 and a second end remote from the first end. Each flexible line conductor 114.1 includes a terminal at its second end comprising two conductive bumps 118.1 as can be seen in FIG. 13B of the drawings. Each flexible line conductor 114.2, likewise, has a first end which is electrically connected to the interface component 164 and a second end remote from the first end which is connected by a via 113 extending though the substrate 112 to a terminal comprising two conductive bumps 118.2 on the side 112.1. It will be appreciated that by having flexible line conductors on each side 112.1 and 112.2 of the substrate 112 it is possible for the substrate 112 to carry more line conductors 114.1 and 114.2.

The flexible connector 110 is sufficiently flexible so that it can fold onto itself without damage to the flexible substrate 112, and is typically made of a material such as polyimide. According to some embodiments, the flexible substrate 112 may have a thickness of 25.4 microns or 49 microns, although a thickness of up to 125 microns is still flexible in a sense that folding onto itself will still be possible without damage to the flexible substrate 112.

Typically, the bumps 118.1, 118.2 are formed of gold and have a width of about 100 micrometers and a height of about 60 micrometers. Gold is preferred as a material for the bumps 118 since it does not oxidize and is able to tolerate temperatures of between 150° C. to 350° C. Further, gold maintains its elasticity within a temperature range of between 180° C. to 240° C. The flexible connector 110 includes a layer 119 which covers the line conductors 114.1 and 114.2. The layer 119 is made of a non-conductive flexible material as can be seen in FIG. 15.

The flexible connector 110 is electrically connected to the rigidly, substantially unbendable electrical contactor 26 of the contactor assembly 40. For this purpose, the electrical contactor 26 has a plurality of electrical contact elements 120 that are compatible for electrical connection to the conductive bumps 118.1 and 118.2 of the flexible connector 110. FIG. 15 shows a layout of the electrical contact elements 120 on the electrical contactor 26. Referring to FIG. 15, it will be seen that the electrical contact elements 120 are generally rectangular and are arranged in two rows 125. Each of the elements 120 has a flat contact surface 120.1. The contact surfaces 120.1 of all the electrical contactor elements 120 are in the same plane. In one embodiment, each electrical contact element 120 has lateral dimensions of 125 and 500 microns and a height of 30 microns. In this embodiment, the electrical contact elements 120 are spaced on a pitch of 100 microns. The electrical contactor elements 120 are typically formed of gold which provides a fairly robust connection with the conductor bumps 118.1 and 118.2. The electrical connection between the flexible connector 110 and the electrical contactor 26 has a low profile and in one embodiment is only about 6 millimeters high.

Figure 15:
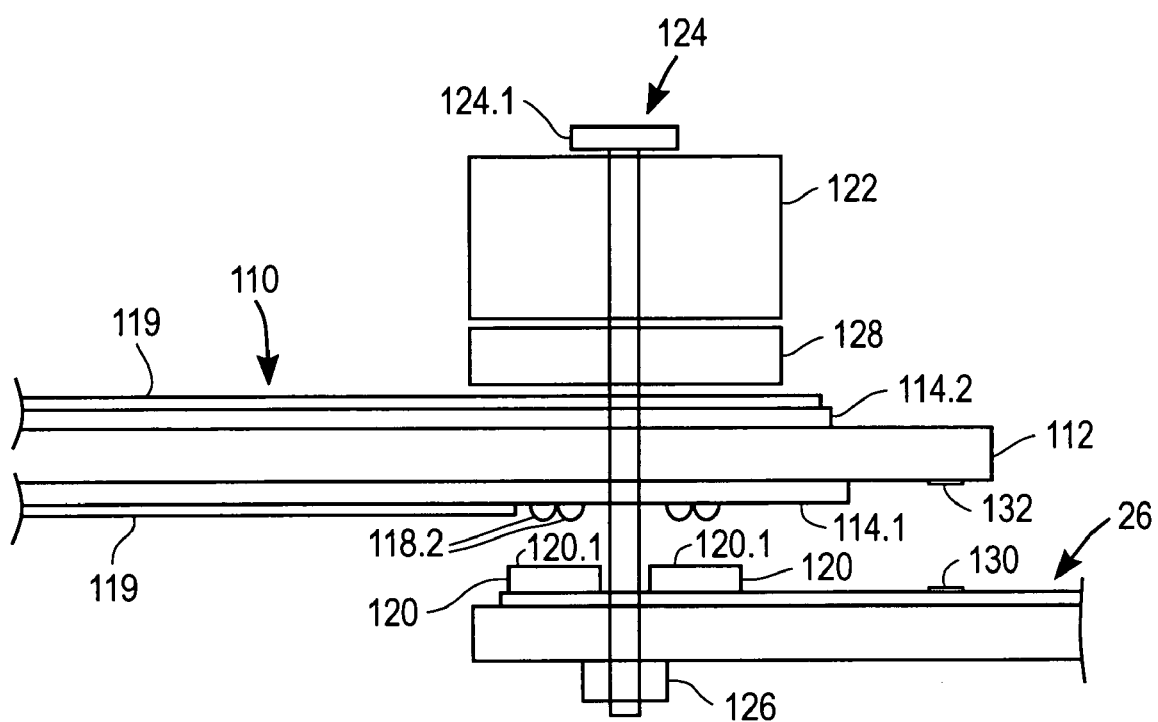
FIGS. 15 and 16 are block diagrams showing different stages in the formation of an electrical connection between the flexible electrical connector and the electrical contactor of FIG. 12.

FIG. 15 of the drawings shows a block diagram of a stage in the formation of the electrical connection between the flexible connector 110 and the electrical contact elements 120.

Basically, in order to form the electrical connection between the flexible connector 110 and the electrical contactor 26, the second end 116 of the flexible electrical connector 110 is clamped onto the electrical contactor 26 using a clamp. The clamp comprises a first clamping member in the form of an elongate bar 122 of a work hardened metal and a second clamping member which is defined by the electrical contactor 26. A coefficient of thermal expansion of the metal bar 122 is matched to a coefficient of thermal expansion of the electrical contactor 26. In one embodiment, the coefficient of thermal expansion of the metal bar 122 is within 0.5 ppm/° C. of the coefficient of thermal expansion of the electrical contactor 26.

The elongate metal bar 122, the flexible connector 110, and the electrical contactor 26 have axially extending holes to receive a fastening bolt 124 therein. A nut 126 mates with threads on the bolt 124 and urges the conductive bumps 118.1 and 118.2 into contact with the electrical contactor elements 120 to a position shown in FIG. 16 of the drawings. The clamping force exerted by the fastening bolt 124 causes the conductive bumps 118.1 and 118.2 to bear against the electrical contactor elements 120 which results in an elastic and plastic deformation of the conductive bumps 118.1 and 118.2. This ensures good electrical contact between the conductive bumps 118.1 and 118.2 and the electrical contactor elements 120.

Because the fastening bolt 124, the metal bar 122 and the conductive bumps 118.1 and 118.2 may have different thermal coefficients, and due to the high temperatures achieved during the burn-in testing, the fastening bolt 124 may lengthen during the burn-in testing. This results in a gap between a head 124.1, of the fastening bolt 124, and the metal bar 122.

Figure 16:
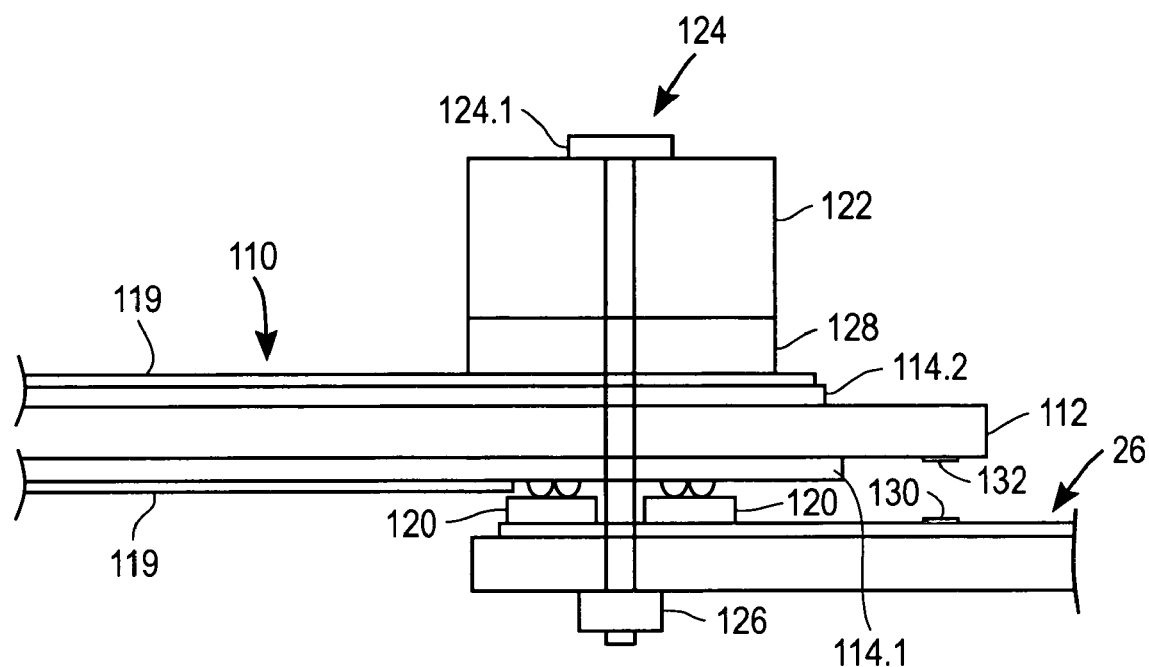

It will be appreciated that such a gap will release the clamping force exerted by the fastening bolt 124 on the flexible connector 110. In order to compensate for the tendency for such a gap to be created, an expander member 128 of resilient material may be interposed or sandwiched between the elongate metal bar 122 and the flexible connector 110 as can be seen in FIG. 16. The expander member 128, which is compressed under the clamping force generated by tightening of the fastening bolt 124 and relaxes or expands if lengthening of the fastening bolt 124 occurs. Thus, the expander member 128 takes up any gap between the head 124.1 and the metal bar 122, thereby to maintain the clamping force of the fastening bolt 124. The expander member is of a material that is able to withstand the elevated temperatures within a burn-in chamber. Further, since a height of the conductive bumps 118.1 and 118.2 may vary, the expander member 128 deforms the flexible substrate 112, differentially to compensate for variations in the height of the conductive bumps 118.1 and 118.2.

Figure 12A:
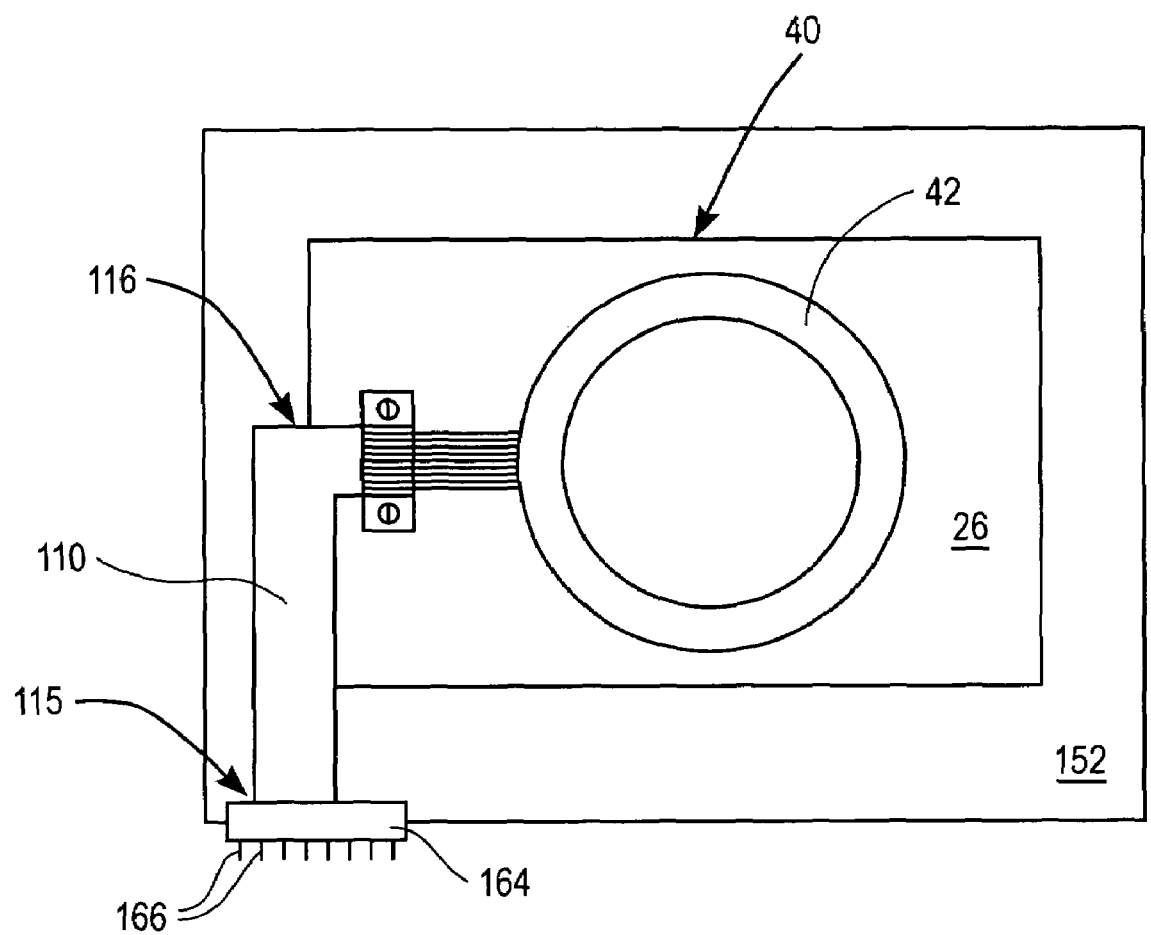
FIG. 12A is a block diagram of the probe plate showing a flexible connector in accordance with another embodiment of the invention electrically connecting a contactor assembly to the probe plate.
Figure 12B:
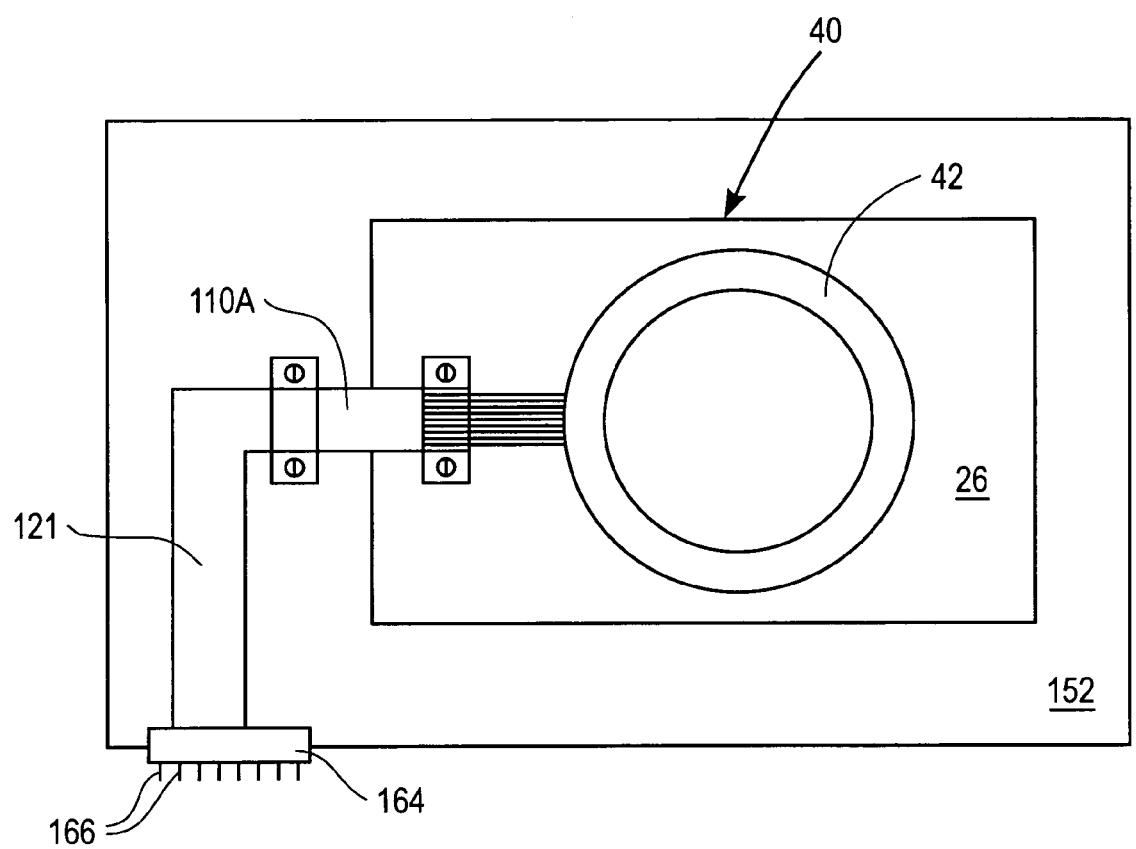
FIG. 12B is a block diagram of a probe plate showing a flexible connector in accordance with one embodiment of the invention electrically connecting a contactor assembly to the probe plate.

FIG. 12A shows another embodiment 110A of a flexible connector. The flexible connector 110A is similar to the flexible connector 110, except that each end thereof has conductive bumps similar to the bumps 118.1 and 118.2. One end of the flexible connection 110A is clamped to the electrical contactor 26 as described above and an opposite end of the flexible connector 110A is clamped, in a similar fashion, to a connector 121 which carries electrical signals to and from the external interface 164.

Figure 17:
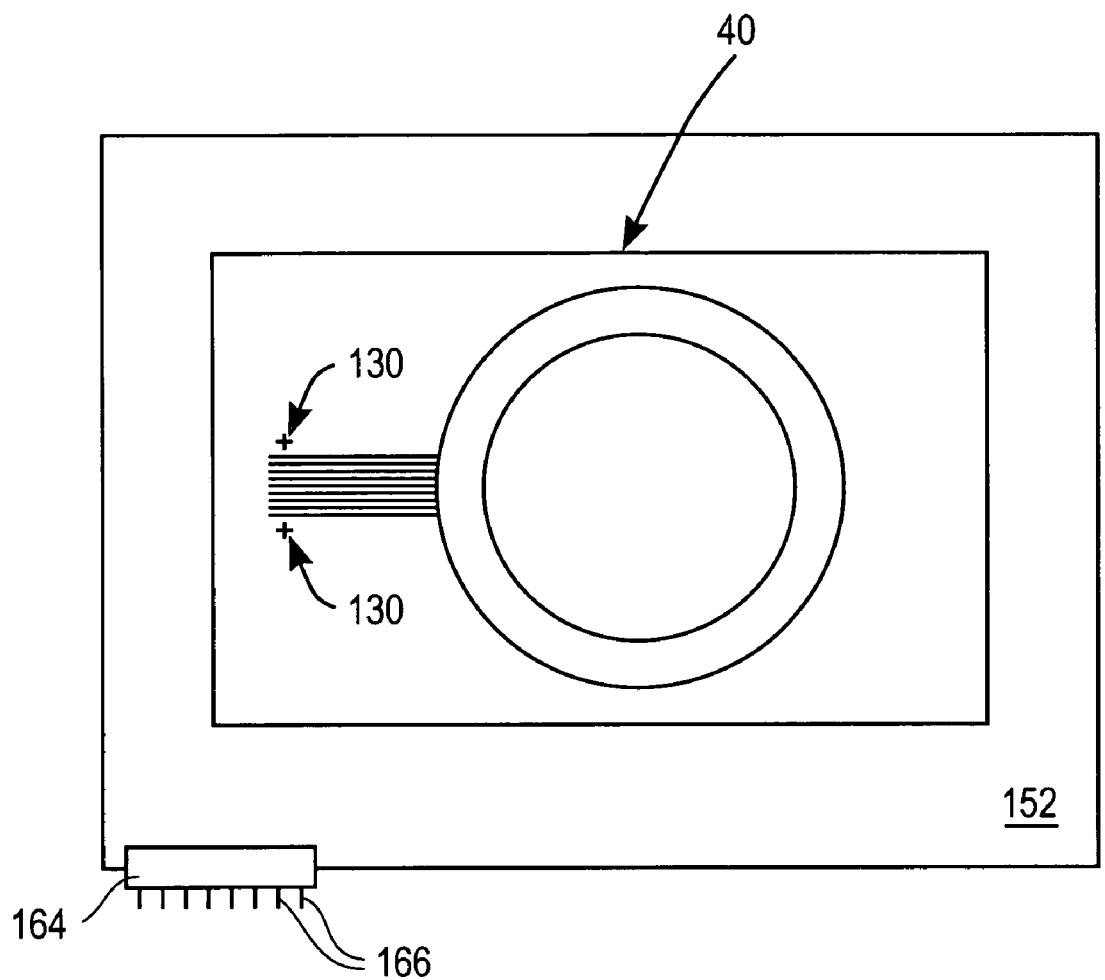
FIG. 17 is a block diagram of the probe plate of FIG. 12 wherein without the electrical connector and showing fiducial markings on the contactor assembly.

The contactor 26 includes fiducial markings 130 (as can be seen in FIG. 17) to facilitate alignment of the conductive bumps 118 with the electrical contactor elements 120 prior to clamping. The fiducial markings 130 are visible through the flexible connector 110. The flexible connector 110 has complementary fiducial markings 132 (as can be seen in FIG. 13B) which can then be aligned with the fiducial markings 130 on the contactor 26 to ensure alignment of the conductive bumps 118 with the contactor elements 120.

Figure 18:
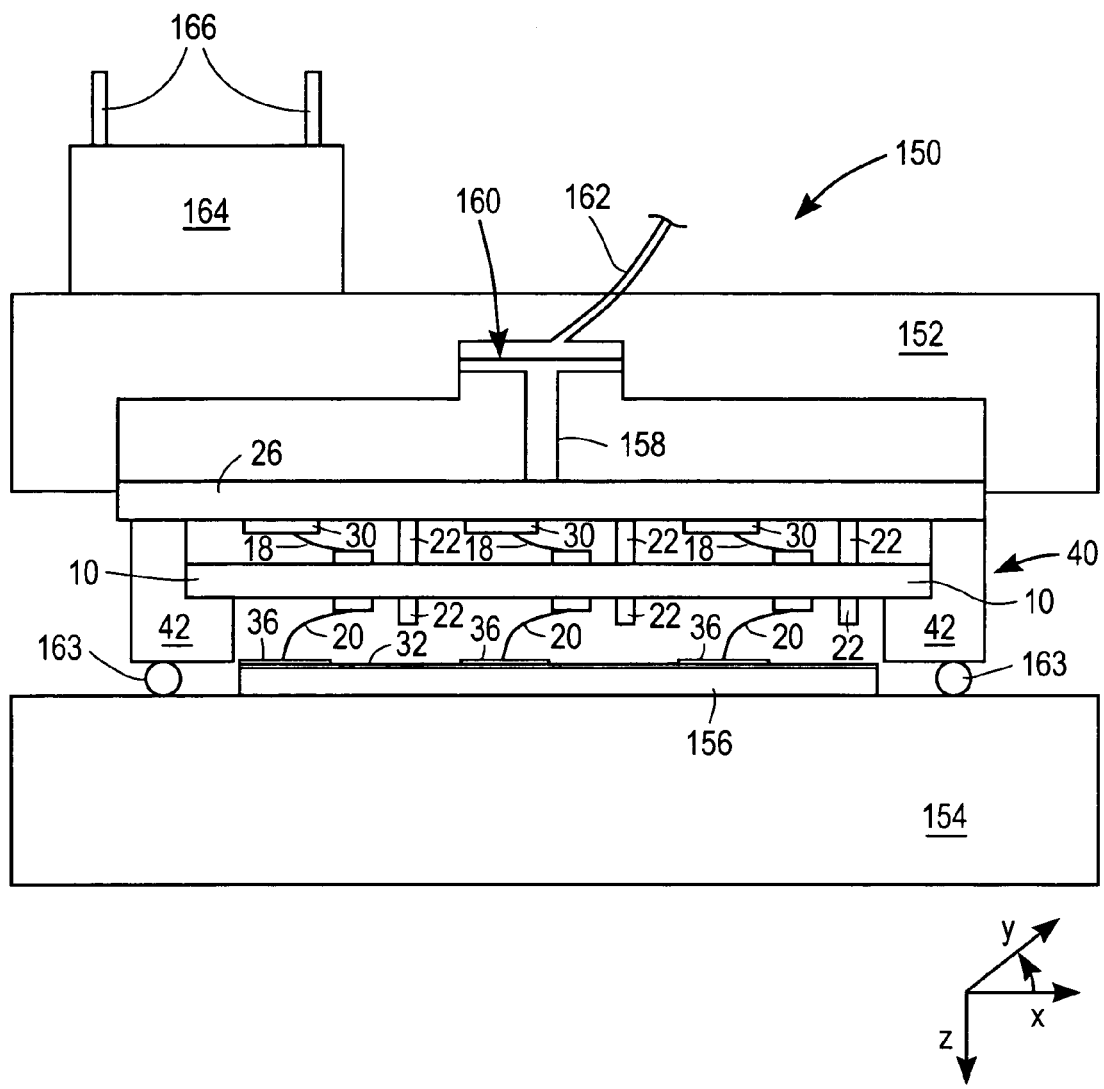
FIG. 18 is a block diagram of a test probe assembly in accordance with one embodiment of the invention.

FIG. 18 of the drawings illustrates the components of test probe assembly 160 in accordance with one embodiment of the invention. The test probe assembly 150 includes a probe plate 152 and a chuck plate 154 which together define a space therebetween for receiving a contactor assembly such as the contactor assembly 40 shown in FIG. 2 of the drawings.

The chuck plate 154 has a pedestal 156 which provides support for the wafer 32. The probe plate 152 includes a piston 158 which is displaceable in a cylinder 160 by a hydraulic fluid which, in use, is introduced into the chamber 160 through a hose 162 which is releasably connectable to the cylinder 160. The piston 158 is connected to an electrical contactor 26 of the contactor assembly 40.

In use, air is introduced intro the chamber 160 through hose 162 to urge the piston 158 to move in a z direction, thereby to displace the contactor assembly 40 towards the chuck plate 154 until the mechanical alignment stops 22 on the side 14 of the interposer 10 make contact with the side 34 of the wafer 32. A resiliently deformable member in form of an O-ring 163 positioned between the ring 42 and the chuck plate 154 serves to limit or control how much displacement of the contactor assembly 40 is produced by movement of the piston 158. Thus, movement of the piston 158 does not require precise control. Further, the O-ring 163 provides a seal between the ring 42 and the chuck plate 154. The O-ring 163 allows for variations in which the faces 46 of the ring 42 may not be on the same z-plane by cushioning the ring 42 as it is displaced towards the chuck plate 154. In some embodiment, the O-ring 163 may be replaced by springs which provide a reaction against movement of the piston 158. Once the mechanical stops 22 of the side 14 of the interposer 10 contact the side 34 of the wafer 32, the interconnection spring elements are compressed thereby to achieve good electrical contact between the interconnection spring elements 20 of the interposer 10 and the electrical terminals 36 of the wafer 32. Thereafter, the hose 162 is removed. The probe assembly 152 also includes a securing mechanism to releasably secure or fasten the chuck plate 154 to the probe plate 152. The securing mechanism has not been shown in FIG. 12, but includes any suitably clamping arrangement such as the kinematic couplings of U.S. Pat. No. 6,340,895 which is hereby incorporated by reference. The test probe assembly 150 is then inserted into a test burn-in chamber wherein the electrical connection pins 166 are received in complementary electrical sockets.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. A contactor assembly for electrically connecting an electrical test component to a testing machine for testing the test component, the contactor assembly comprising:
   a first test structure, the first test structure comprising:
      a first plurality of electrical terminals;
      a first plurality of resilient interconnection elements, each having a first end connected to an electrical terminal of the first plurality of electrical terminals and a free end opposite the first end to electrically contact the test component; and
      a second plurality of resilient interconnection elements, each having a first end connected to an electrical terminal of the first plurality of electrical terminals and a free end opposite the first end to electrically contact a second plurality of electrical terminals;
   a second test structure, the second test structure comprising:
      the second plurality of electrical terminals; and
      a plurality of electrical contact elements distant from the electrical terminals;
   a retaining component to secure the position of the first test structure to a relative position of the second test structure; and
   an electrical path bridging each electrical terminal with a respective one of the electrical contact elements, wherein each electrical contact element has a body which defines a flat surface to provide support to matching contactor elements when the matching contactor elements are deformed under a clamping force.

2. The contactor assembly of claim 1, wherein the resilient interconnection elements comprise springs.

3. The contactor assembly of claim 1, wherein the second test structure comprises a plurality of apertures formed therein to cooperate with clamping members to clamp the matching contactor elements.

4. The contactor assembly of claim 3, wherein the second test structure further comprises fiducial markings to facilitate alignment of the electrical contact elements with the matching contactor elements.

* * * * *